United States Patent [19]

Miller et al.

[11] Patent Number: 5,130,568
[45] Date of Patent: Jul. 14, 1992

[54] SCANNABLE LATCH SYSTEM AND METHOD

[75] Inventors: Brent W. Miller, Menlo Park; William W. Walker, Los Gatos; Laurence H. Cooke, San Jose, all of Calif.

[73] Assignee: Vertex Semiconductor Corporation, Sunnyvale, Calif.

[21] Appl. No.: 609,398

[22] Filed: Nov. 5, 1990

[51] Int. Cl.$^5$ .................. H03K 3/289; H03K 3/286
[52] U.S. Cl. .............................. 307/272.2; 307/272.1; 324/158 R; 371/22.3
[58] Field of Search ............ 307/272.2, 279, 272.1; 324/158 R; 371/22.3

[56] References Cited

U.S. PATENT DOCUMENTS

| | | | |
|---|---|---|---|
| 3,539,836 | 11/1970 | Seelbach et al. | 307/269 |
| 3,984,702 | 10/1976 | Fett | 307/238 |
| 4,258,273 | 3/1981 | Straznicky et al. | 307/221 R |
| 4,357,703 | 11/1982 | Van Brunt | 371/15 |
| 4,419,762 | 12/1983 | Paul | 377/66 |
| 4,424,581 | 1/1984 | Kawai | 365/154 |
| 4,495,628 | 1/1985 | Zasio | 377/70 |
| 4,495,629 | 1/1985 | Zasio et al. | 377/70 |
| 4,540,903 | 9/1985 | Cooke et al. | 307/465 |
| 4,553,236 | 11/1985 | Zasio et al. | 371/15 |
| 4,587,480 | 5/1986 | Zasio | 324/73 R |
| 4,621,363 | 11/1986 | Blum | 371/25 |
| 4,646,331 | 2/1987 | Ely | 307/529 |
| 4,782,283 | 11/1988 | Zasio | 324/73 R |
| 4,785,200 | 11/1988 | Huntington | 307/279 |
| 4,912,709 | 3/1990 | Teske et al. | 371/22.3 |
| 5,015,875 | 5/1991 | Giles et al. | 307/272.2 |

FOREIGN PATENT DOCUMENTS

| | | | |
|---|---|---|---|
| 0079328 | 5/1983 | Japan | 307/272.2 |
| 0158817 | 6/1989 | Japan | 307/272.2 |

*Primary Examiner*—Stanley D. Miller
*Assistant Examiner*—Terry D. Cunningham
*Attorney, Agent, or Firm*—A. C. Smith; Greg T. Sueoka

[57] ABSTRACT

A scannable latch system comprises a plurality of scannable latches and clock driver circuit that allow at-speed testing of integrated circuits. Each scannable latch comprises a master latch, a slave latch and an auxiliary latch. The master latch is a two input latch capable of receiving data from two sources. The output of the master latch is coupled to the input of the slave and auxiliary latches. The clock driver circuitry receives a clock and control signals which are transformed into signals that operate the scannable latch in three different modes. In the normal mode, the slave latch is transparent and the data is held primarily in the master latch. In the scan mode, data may be shifted into the master, shifted out through the auxiliary latch, or shifted both in and out with a propagate function. Finally, in a test mode independent data values may be stored in the master latch and the slave latch.

5 Claims, 7 Drawing Sheets

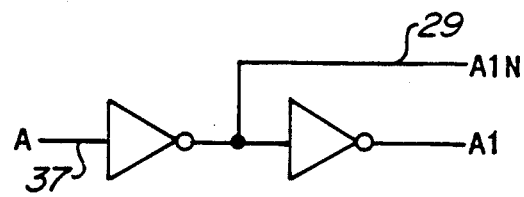
Figure 3A
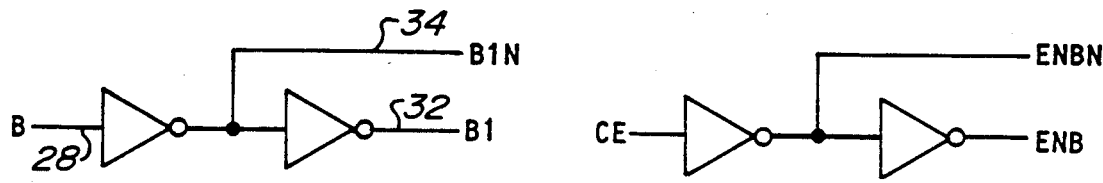
Figure 3B
Figure 3C
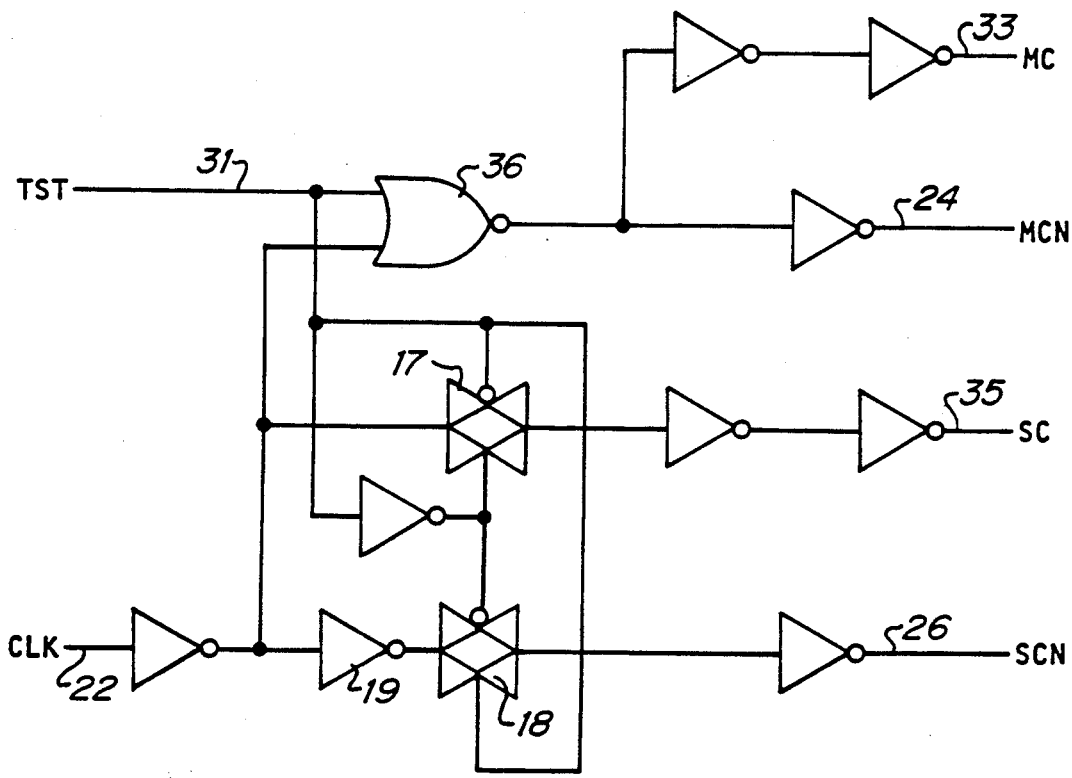
Figure 3D

SCANNABLE LATCH SYSTEM AND METHOD

BACKGROUND OF THE INVENTION

1. Field of the Invention

This invention relates to latch, driver and clocking circuits in CMOS technology, and more particularly to such circuits and clocking sequences therefor which control master latch and slave latch circuits to facilitate at-speed testing and operation.

2. Description of the Related Art

Computational systems are composed of a collection of circuitry that may be either sequential or combinational in nature. A sequential circuit is one whose output logic state is dependent upon a prior event, an input and a time coincident clocking pulse. The output of a sequential circuit usually remains constant until the next sequence of clocks is applied to the circuit. In contrast, a combinational circuit is one whose output depends solely upon the state of the data inputs and the logical function of the circuitry, independent of time. The output of a combinatorial circuit will only remain stable while the input signals to that circuit remain unchanged.

Computation systems commonly include numerous latches that operate in selected sequences during recurring clock intervals to capture and hold certain data for a period of time sufficient for the other circuits within the system to further process that data. At each clock signal, data is stored in a set of latches whose outputs are available to be applied as inputs to other combinatorial or sequential circuitry during successive clock signals. In this manner, sequential logic circuits are operated to capture, store, and transfer data during the successive clock signals.

Certain known latch circuits operate as scannable latches that can be assembled as shift registers to shift data in as well as to shift data out under the control of applied clock signals. In response to proper control signals, such scannable latches can be interrupted from normal operation to shift out existing data for examination, or to shift in test data for further processing to yield test results. Scannable latches of this type are described in the literature (see, for example, U.S. Pat. No. 4,495,629).

Faulty circuitry can be readily isolated through the use of scannable latches. Faulty circuitry is caused by the failure of a particular circuit element to perform the correct logical operation or by a timing fault. The former type of fault is called a static fault and is readily detectable using the normal scan test techniques of the prior art. Timing faults, on the other hand, occur when the combinatorial logic elements fail to perform their function within the minimum time period specified by the system clock interval. Time dependent faults are not easily detected using the scan testing techniques because they often require testing the circuit in question at a clock period equivalent to the minimum clock period specified by the original design parameters. Such testing is called "at-speed" testing.

At-speed testing may be further complicated due to the complexity of the circuit in question, and the interconnecting logic to the input latches of that circuit. To be fully efficient, an at-speed testing technique must permit control of all the inputs and observation of all the outputs of the combinatorial section of logic to be tested. Furthermore, such at-speed technique must be capable of providing a logical transition at each of the inputs and a means of observing the resulting circuit transition on the output. Current scan testing techniques do not provide this capability.

SUMMARY OF THE INVENTION

Accordingly, in the preferred embodiment of the present invention, an improved scannable latch and clock driver circuitry comprises master and slave latches that operate on clock signals to facilitate at-speed testing of combinatorial logic functions. This invention provides the capability to perform standard D-type flip-flop functions with parallel and serial input and output including serial scan-in, scan-out, and data propagate functions for accurate at-speed testing of attached combinatorial logic.

In normal operation, the clock driver circuit controls the master and slave latches so that data is held in the master latch when the clock signal is inactive. Data is passed directly through the slave latch which acts as a transparent latch presenting only minimal delay to the data signal. When the clock signal is active, an enable function allows data to enter the master latch from either the data input port or from a data feedback loop from the slave latch output. Data is prevented from passing to the slave latch until the clock signal is returned to an inactive state.

During scan operation, three modes are provided: scan data in, scan data out, and propagate data. The scan-in function allows data to be shifted into the master through the scan-in port when the scan-in clock is active and is not dependent upon system clock operation. The scan-out function outputs data from the master latch through the auxiliary latch to the scan output port. Scan-out is accomplished when the scan-out clock is active and is independent of the system clock operation. The data propagate function simultaneously performs a scan-in and scan-out operation. This is accomplished by holding both the scan-in clock and scan-out clock active at the same time. With both clocks active, the scan output data will follow the scan input data independent of the system clock.

In test operation, the clock driver circuits provide isolation of the master and slave latches so that independent data values can be stored in each. Therefore, data can be written into the master latch while the slave latch is disabled for writing data during a scan-in operation, and the slave latch thus remains unaffected by that scan-in operation.

The method of the present invention provides maximum or at-speed testing using a source flip-flop before a logic circuit and a target flip-flop following the logic circuit. First, an initial setup vector (i.e., data set or test signal) is scanned into the master latches of the source flip-flops using the scan-in operation. At the end of the scan-in operation, a system clock is produced to transfer the setup vector to the slave latches. A second vector, called the switching vector, is then scanned into the master latches. The next system clock launches the switching vector from the master latch as a signal source toward a target logic circuit, and the master latch of the target flip-flop is set to capture the data upon the issuance of a second system clock. After capture of the result data by the target flip-flop, such data is then shifted out via a scan-out operation for comparison with expected test results.

BRIEF DESCRIPTION OF THE DRAWINGS

FIGS. 3A, 3B, 3C and 3D are a schematic diagram of a preferred embodiment of a clock driver circuit to operate the scannable latch circuit of FIG. 2;

DESCRIPTION OF THE PREFERRED EMBODIMENT

Figure 1:
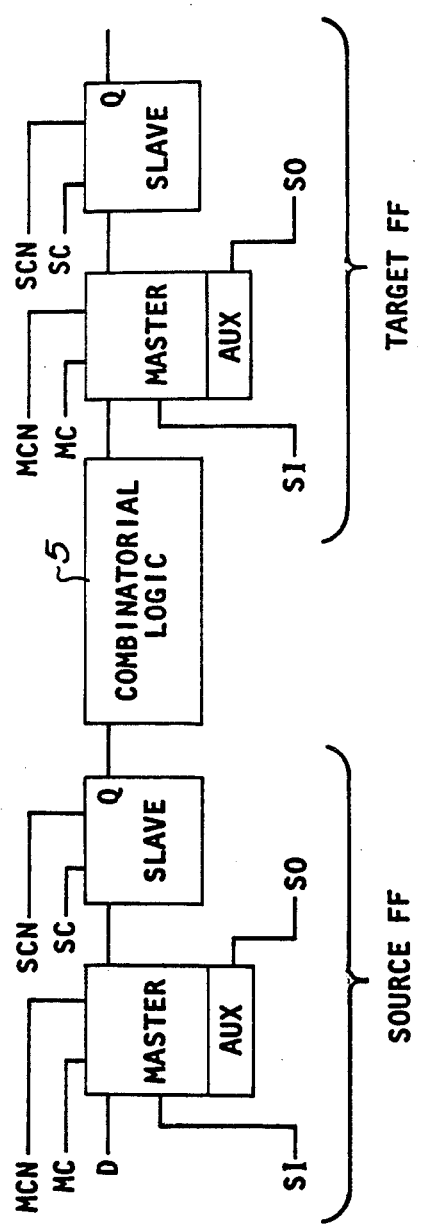
FIG. 1 is a block diagram of logic circuitry to be tested.

Referring now to FIG. 1, there is shown a block schematic diagram of logic circuitry including a D-type source flip-flop on the left side having master and slave latches, and a D-type target flip-flop on the right side having master and slave latches, with a logic circuit 5 connected between the source flip-flop and the target flip-flop. Scan testing is particularly useful in isolating logic circuitry that is operating improperly or is stuck in a single logic state. To test the speed of the logic circuit 5, all paths through the source and target flip-flops are sensitized in preparation for testing according to the present invention. First, a known value is set into the target flip-flop. Then two clocks are issued at controlled intervals. The first clock releases data from the source flip-flop which should produce a prescribed change in the target flip-flop if the intermediate logic circuit 5 is operating properly. The second clock captures the change in the target flip-flop. If there is a timing fault in the data path, the second clock will arrive at the target flip-flop before the test data arrives, thereby indicating and localizing a fault.

Figure 2:
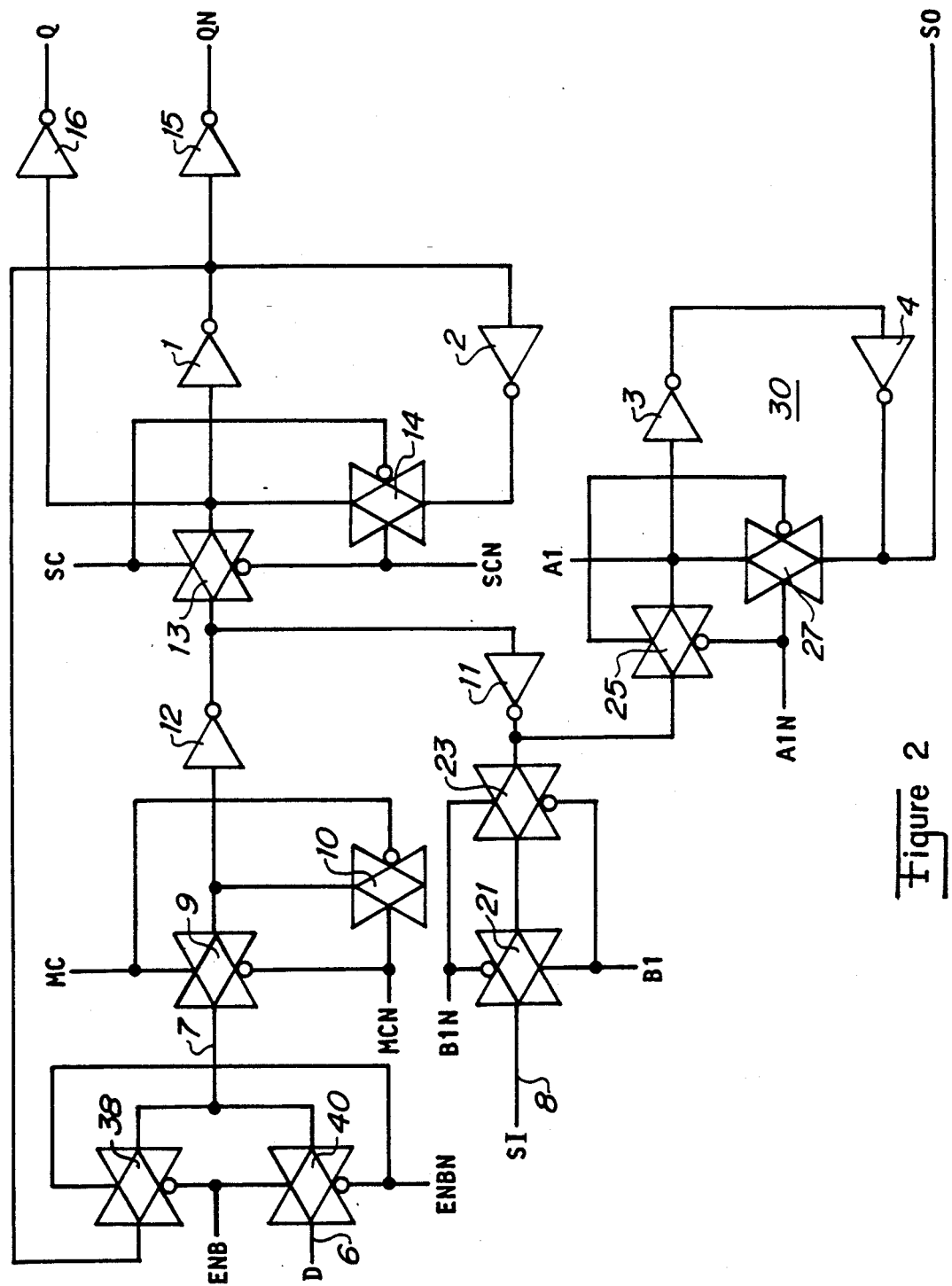
FIG. 2 is a schematic diagram of a preferred embodiment of a scannable D-flip-flop latch circuit of the present invention.

Referring now to FIG. 2, there is shown a schematic diagram of a scannable D-flip-flop latch circuit, for example, using conventional CMOS technology to form master, slave and scan latches on a common integrated circuit substrate for operation in the circuit of FIG. 1. Of course, many such D-flip-flops may be formed on a common substrate and assembled into shift registers. Using conventional schematic notations, the master latch can be viewed as a two input latch comprising transmission gates 9, 10, 21, 23 and inverters 11 and 12. The slave latch is illustrated as a one input latch comprising transmission gates 13, 14 and inverters 1 and 2. There is also an auxiliary latch having one input illustrated as including transmission gates 25, 27 and inverters 3 and 4. The auxiliary latch is connected to the master latch through inverter 11 and transmission gate 25.

Generally, transmission gates as referred to herein are standard CMOS circuits that pass signals when the correct polarity signal is applied to the control inputs and block the signal when the opposite polarity is applied. Each transmission gate has two control inputs, each of opposite polarity, that control the state of the transmission device. The fiducial symbol (designated by a small circle) on a control input indicates that the control is active, or on, when a low level logic signal is applied. A transmission gate control input without the fiducial symbol is active whenever a high level logic control signal is applied. The control signals applied to a transmission gate will always be of opposite polarities. For this discussion, a transmission gate is considered closed, on, active, or enabled when it passes data from input to output. A transmission gate is considered open, off, inactive or disabled when it blocks data from passing input to output.

In normal operation, the control clock signals (MC, MCN, SC and SCN) for the master and slave latches are generally in opposite phase relationships. Thus, the slave latch will pass data signals through to the QN and Q outputs, 15, 16 and to other circuits (not shown) that may be connected thereto and which form part of the logic circuitry that is being tested for proper operation. Data appearing at a D input 6 will pass through a transmission gate 40 when the enable signal (ENB) is high. It then passes through the transmission gate 9 and the inverter 12 of the master latch when control signal MC is high (and control signal MCN is low). Similarly, data signals pass through the transmission gate 13 of the slave latch, and one or more inverters to the outputs QN and Q 15, 16 when the control signal SC is high (and control signal SCN is low). Inverter 11 and transmission gates 23 and 10 form the feedback path to provide latching of the data in the master latch when the MC signal is returned to a low state. Inverter 2 and transmission gate 14 provide the feedback path to provide latching of the slave data whenever the SC signal is low. The remaining transmission gates 21, 25 and 27 are enabled or disabled in response to control signals A1, A1N, B1, B1N that are applied to the respective control inputs thereof as more fully described later herein.

Referring now to FIGS. 3A, 3B, 3C and 3D there is shown a clock driver circuit for supplying control signals to the scannable latch of FIG. 2. The CLK and TST signals are applied to inputs 22 and 31 respectively. In the normal modes of operation (control signal TST at a low logic level), the CLK signal applied to input 22 causes signals MC and SC (and correspondingly MCN and SCN) to be in opposite polarity from each other. This is accomplished by routing the CLK signal through a NOR gate 36 to generate signals MC and MCN on outputs 33 and 24 respectively, and by passing the CLK signal through a transmission gate 17 to generate the SC and SCN signals on outputs 35 and 26 respectively. Now with reference to FIG. 2, data is transferred into the master latch on the positive transition of the CLK signal through transmission gate 9. On the negative edge of the CLK signal, the data is passed through the slave latch to the Q and QN outputs 16, 15 via transmission gate 13 and the associated inverters. On this same edge of the CLK signal, transmission gate 9 is opened and transmission gate 10 is closed causing the data to be latched in the master latch. Since, in the normal mode, the data passes through the slave to the output, the slave portion of the flip-flop acts as a transparent latch.

In test mode operation, the TST signal applied to input 31 of FIG. 3D is brought to a high logic level causing control signal MC to be driven to a low logic level (and MCN to a high level) through NOR gate 36. The MC signal will remain low (and MCN will remain high) as long as the TST signal remains high regardless of the state of the CLK signal on input 22. With MC at a low logic level, data from the input 6 to the master latch on FIG. 2 is blocked allowing values to be clocked into the slave latch via the master using the CLK signal as will be described more fully herein.

Again referring to FIGS. 3A, 3B, 3C and 3D, the TST signal applied to input 31 causes the polarity of signal SC (and SCN) to be inverted from its polarity during normal operation. This is accomplished by blocking transmission gate 17 and routing the CLK signal through an inverter 19 and transmission gate 18 causing one additional level of inversion on the signal. When the TST signal is initially brought to a high level, both the master and slave latches of FIG. 2 are caused to latch their present values as a result of control signal MC being low (and correspondingly MCN being high) and signal SC being low (and SCN being high). In this state, signals can now be scanned into the master latch in the manner previously described. Data so scanned-in, will not be transferred to the slave latch until the CLK signal on input 22 of FIG. 3D is brought to a high logic level and such data will be captured into the slave latch when the CLK signal is returned to a low logic state. The isolation between the master and slave latch in the test mode permits independent values to be stored in each of these latches. The data is launched to the logic circuit 5 of FIG. 1 on the rising edge (low to high level) transition of the CLK signal.

After the data launch and prior to returning the CLK signal to a low level, the TST signal on input 31 of FIG. 3D is returned to a low value causing the MC signal on output 33 of FIG. 3D to transition to a high level (and correspondingly, signal MCN on output 24 to transition to a low) which enables the master latch in the target flip-flop to receive the resulting data from the logic circuit 5 of FIG. 1. When the CLK signal is returned to a low level, the MC signal returns low and the MCN signal returns to a high level causing the master latch in the target flip-flop to capture the output data.

In Scan mode operation (with the CLK and TST signals of FIG. 3D at a low logic level), data can be either scanned into or out of the master latch. To perform a scan-out operation, scan signal A1 is brought to a high level (and A1N is made low) causing data to pass through transmission gate 25. When signal A1 is brought back low, transmission gate 25 is opened and transmission gate 27 is closed causing the data to be captured in auxiliary latch 30 and to appear on an output SO. To perform a scan-in operation, control signal B1 is made high (and control signal B1N is low) causing transmission gate 21 to close and 23 to open which allows the scan-in data from an input SI to be fed into the master latch through transmission gates 21 and 10. Once the data is shifted in, it is latched in the master latch when transmission gate 21 is disabled and transmission gate 23 is enabled, thus completing the master latch feedback path. Since control signal SC is at a high logic level (and control signal SCN is low) the data on the master latch is transferred directly into the slave latch. During a scan-in operation with the TST control signal at a high logic level (Test Mode operation) data is not transferred to the slave latch until the occurrence of a system clock.

Multiple flip-flops can be connected together via the SI input and the SO output to form a shift register chain (also referred to in the literature as a scan ring). By the use of alternate shift in, shift out operations, specific data can be transferred to any location in the chain to provide test stimuli for a target segment of logic circuitry to be tested that would be connected at the outputs 15 and/or 16 (Q and/or QN).

To perform at-speed testing, a value is scanned into the source flip-flop master latch and then clocked to transfer the data to the source flip-flop slave latch. This first set of data remains stored in the slave latch while a second set of data can be shifted into the master latch. Then, on the first successive clock signal, data in the master latch can be transferred through transmission gate 13 to the QN and Q outputs 15, 16. On the second successive clock signal, and after the TST signal is brought low, the output of the logic circuit 5 driven by the QN or Q outputs 15, 16 of the source flip-flop will be latched into the target master latch. The time interval between the rising and falling edge of the second clock is the time interval of interest because it is desirable to determine whether the logic circuit 5 operates sufficiently fast to provide the predicted output within such time interval. The slave latch is enabled between such first and second clocks, and the master latch of the target flip-flop is incapable of accepting data from the data input 7 until the TST signal is made low, in the manner as later described herein.

Figure 4:
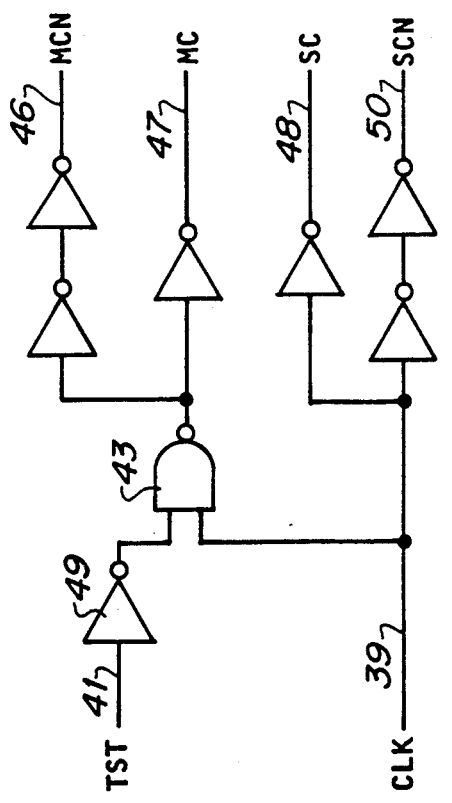
FIG. 4 is a schematic diagram of an alternate embodiment of a portion of the clock driver circuit for operating the scannable latch circuit of FIG. 2.

As previously described, the circuits of FIGS. 3A, 3B, 3C, and 3D launch the test data to the logic circuit 5 of FIG. 1 on the rising edge of the CLK signal and capture the test result in the target master latch on the falling edge of the CLK signal. In this embodiment, the critical timing is determined by two different edges of the CLK signal. Due to the electrical characteristics of CMOS circuits, there may exist timing differences between rising (low level to high level) and falling (high level to low level) transitions. It is also sometimes simpler and more desirable to use the full clock period (or total cycle time) as the critical time measurement. The diagram of FIG. 4 shows an alternate embodiment for a portion of the clock driver circuit of FIG. 3D that causes the data to be launched and captured on the negative transition of the CLK signal. The circuit of FIG. 4 has essentially the same circuit delays as that of FIG. 3D and provides the critical timing interval based on the clock period.

In normal mode, the circuit of FIG. 4 performs the same function as its counter part in FIG. 3D. With the TST control signal on an input 41 held low, CLK is propagated through a NAND gate 43 and one inverter to produce the MC signal on an output 47. Similarly, the signal MCN on an output 46 is of the opposite polarity as the MC signal. The SC signal on an output 48 is out of phase with CLK while the SCN signal on an output 50 is of the same phase. In the normal mode, each output signal in FIG. 4 has the same resulting polarity when compared to the CLK signal as those of FIG. 3D.

In the test mode, the TST signal applied to input 41 of an inverter 49 is brought to a high level resulting in a low level on the MC output 47 (and a high level on output 46). This latches data in the master and blocks new data from entering through input D of FIG. 2. Since the CLK signal is initially low, data is passed directly from the master latch to the slave. The clock is then brought to a high level causing the data to be latched into the slave. With the CLK high, the master and slave latches are isolated from each other allowing test data to be scanned into the master in the manner previously described. The CLK signal is then pulsed (high level to low level to high level) causing the test data to be launched through the slave latch to the logic circuit 5 of FIG. 1. The leading edge (high to low transition) of the CLK pulse causes control signal SC on output 48 of FIG. 4 to go high opening transmission gate 13 of FIG. 2 which allows the data to pass through the slave latch to the logic circuit 5 of FIG. 1. After the data has been launched and prior to the next CLK pulse, the TST signal on input 41 of FIG. 4 is brought to a low level. The next leading edge of the CLK pulse (high level to low level transition) causes control signal MC on output 47 of FIG. 4 to go low. This latches the master latch in the target flip-flop capturing the output response from the logic circuit 5 of FIG. 1. The resulting data captured in the master latch of the target flip-flop can now be scanned out for examination and comparison to the predicted results.

Figure 5:
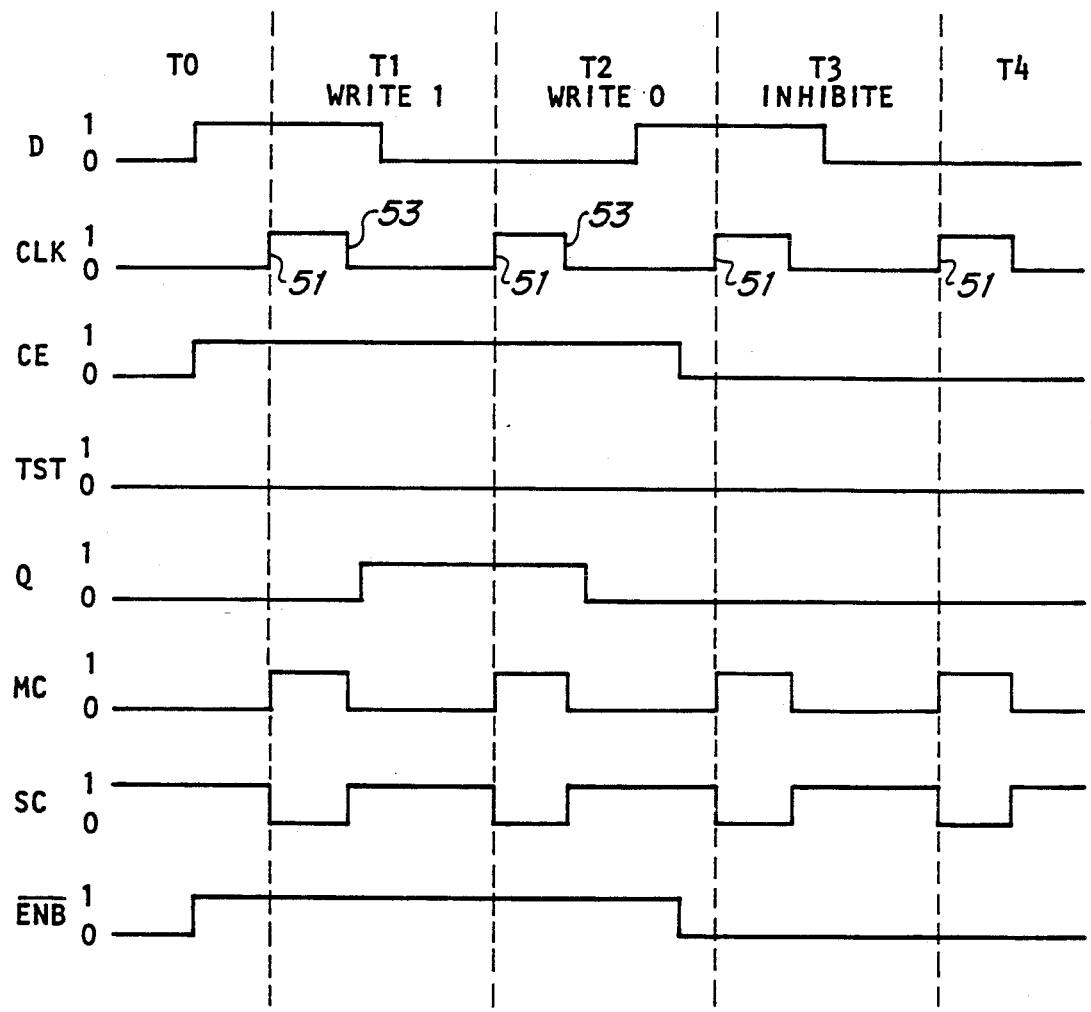
FIGS. 5, 6, 7 and 8 are timing diagrams illustrating waveforms present in the operation of the circuits of FIGS. 2, 3 and 4.

With reference to the timing diagram in FIG. 5, there are shown five typical timing intervals as defined by the rising edges 51 of the CLK signal. In the normal mode of operation (the TST signal at a low level), timing interval T1 defines a normal write "1" cycle, interval T2 illustrates a write "0" cycle, and interval T3 shows the operation of the inhibit cycle.

Prior to the start of interval T1, the data input, D, and the enable input, CE, are both brought to a logical high level. With the clock signal still at a logical low level, the D signal is blocked from passing into the master latch by transmission gate 9. The rising edge 51 of the CLK signal causes control signal MC to go high and control signal SC to go low. This action closes transmission gate 9 allowing the signal to pass into the master latch. Control signal SC opens transmission gate 13 which blocks the data from the slave latch. On the falling edge 53 of the CLK signal, MC returns to a low level and SC goes high. This latches the data into the master and permits passage through the slave latch to the output Q. It should be noted that input signal D overlaps the trailing edge of CLK signal to ensure capturing of the data in the master latch. After this required data hold period, and prior to the next CLK signal, D can change without affecting the data in the master latch. This same process is repeated during interval T2 except that the D signal is brought to a low logic level prior to the rising edge of the CLK signal. In this case, output Q will go to a low level (and output QN will go to a logic high level) on the falling edge 53 of the CLK signal.

In computation systems, it is often desirable to use a common system clock for multiple flip-flops. In such cases, it is necessary to provide the capability of selectively determining those flip-flops that are to be permitted to change during a particular clock cycle. This is accomplished through the use of the clock enable control signal, CE. As illustrated in timing interval T2 and T3 of FIG. 5, the CE signal is brought to a low level prior to the rising edge 51 of the CLK signal. This causes control signal ENB to go low (and ENBN to go high) which opens transmission gate 40 and closes transmission gate 38. In this state, the D input 6 is blocked and the output of the slave latch is fed back through the inverter 1 and transmission gate 38 to the input 7 of the master latch. This holds the value that was latched during the prior clock cycle. This value will remain in the flip-flop until the CE signal is brought to a high logic level and a system clock is issued or until another value is entered to the master latch through a scan-in operation.

Figure 6:
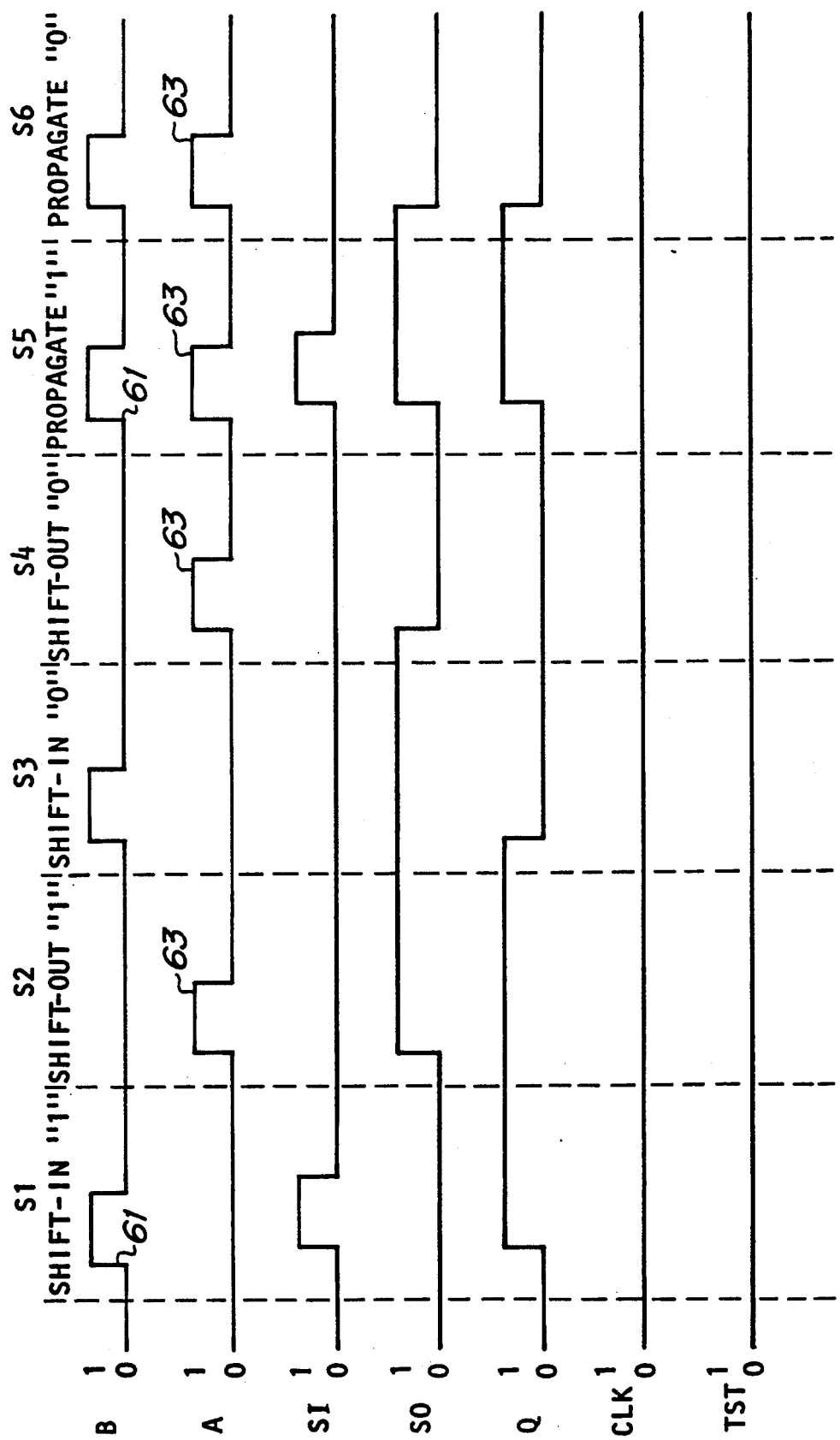

FIG. 6 illustrates the timing relationships necessary to perform the normal mode (TST signal held low) scan functions. There are three basic modes of scan operation embodied in this invention. These are scan-in, scan-out, and propagate. The scan-in mode is intended to set data into the flip-flop. Scan-out extracts data stored in the flip-flop and shifts it out through the auxiliary latch to the SO output. Finally, the propagate mode provides the capability of setting all flip-flops connected on a common scan ring to a logical value of "1" of "0" in a single operation. This last mode is extremely useful for initialization and test purposes. It should be noted that operation of any of the scan functions does not require clocking of the system clock, CLK, to execute.

Referring now to FIG. 6, the shift-in function is initiated by placing a value on the SI input and pulsing the B clock input. On a rising edge 61 of the B clock, control pulse B1 of FIG. 3 goes high (and B1N goes low) causing transmission gate 21 of FIG. 2 to close and transmission gate 23 to open. This places the new value in the feedback path of the master latch. When the B clock is returned low, the SI input is again isolated from the circuit by transmission gate 21 and the feedback path is re-enabled by transmission gate 23. Since both the CLK and TST signals are low during a normal mode scan-in operation, the output of the master latch is automatically fed through transmission gate 13 to Q output 16.

Again referring to FIG. 6, the shift-out function is described with reference to time intervals S2 and S4. The data from the master latch is not transferred to auxiliary latch 30 and the SO output until clock A on input 37 of FIG. 3 is pulsed high 63. When this occurs, control signal A1 goes high (and A1N goes low) causing transmission gate 25 of FIG. 2 to close and transmission gate 27 to open. Data is passed from the master latch feedback path through transmission gate 25, inverters 3 and 4 to the SO output. Since the data in the master latch is not disturbed during a shift-out operation, the Q output 16 is not affected.

In computation systems it is often desirable to be able to initialize or force all latches on a scan string to the same logical value. The preferred embodiment of the present invention provides this capability in the propagate mode. As shown in FIG. 6, with the CLK and TST signals at a low logic level, the propagate mode is initiated by bringing both the A and B clock signals to a high logic level at the same time as illustrated in timing intervals S5 and S6. This causes the shift-in and shift-out functions to occur simultaneously. In this mode, the SO output follows the SI input. Since the scan ring is configured so that the SI input is connected to the SO output of the previous stage, the propagate mode causes all values on the ring to be forced to the SI value applied to the first flip-flop on that ring. Thus, all the flip-flops may be set to a high or low logical level by placing the logical level desired as the SI input to the first flip-flop.

Figure 7:
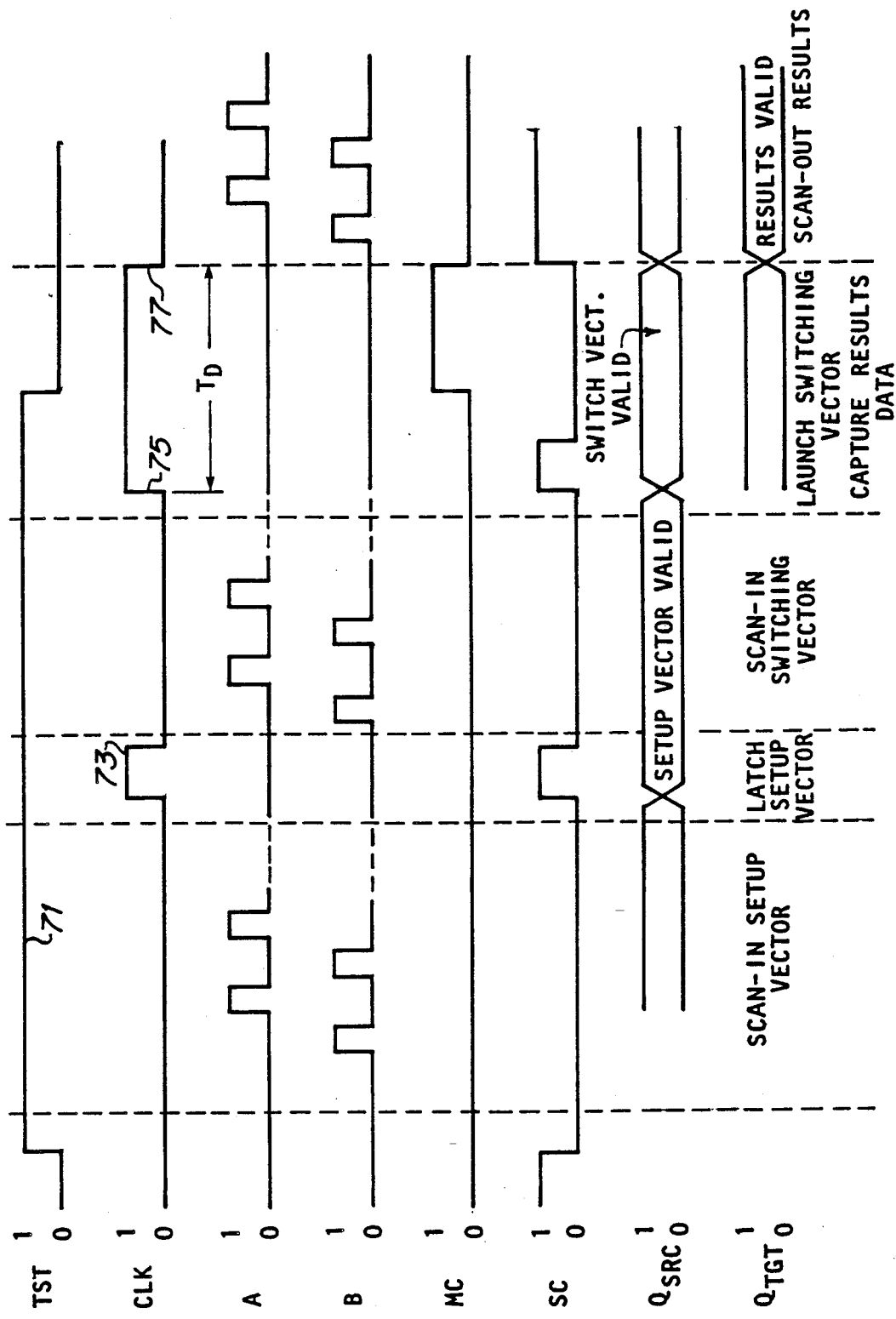

Referring now to FIG. 7, the timing relationships required to operate the preferred embodiment of the present invention in the test mode will be described. The test mode sequence is divided into five basic operations: scan-in the setup vector to the source flip-flop master latch; latch the setup vector in the source flip-flop slave latch; scan-in the switching vector to the source flip-flop master latch; launch the switching vector to the target logic and capture the results in the target flip-flop master latch; and finally, scan-out the captured data for comparison against the predicted response.

As illustrated in FIG. 7, the sequence begins by bringing the TST control signal to a high logic level 71 and holding CLK at logic low. This causes the slave control clock, SC, to invert isolating the master latch from the slave latch. Next, a setup vector is scanned-in using the manner previously described. Since the flip-flops are preferably serially connected into a scan ring, the desired setup vector is serially shifted through each of the preceeding flip-flops by first performing a scan-in and then a scan-out function using the B and A scan clocks. This action is repeated until the desired data rests in the master latch of the source flip-flops. The setup vector is then transferred to the slave latch and onto the target logic when the CLK signal 73 is pulsed. Next, the desired switching vector is scanned into the source flip-flop master latch. The next leading edge 75 of the CLK signal again passes the data through the slave latch to the logic circuit 5. After the data is launched, the TST signal is returned to a low logic level causing the SC signal to return to its normal polarity. The master latch control signal, MC, goes high and allows transmission gate 9 to pass the result data from the logic circuits to the master latch of the target flip-flop. On a falling edge 77 of the CLK signal, transmission gate 9 shuts off and the test result data is latched in the master latch of the target flip-flop. The data is then scanned-out in the manner previously described for comparison to the predicted results. As shown in FIG. 7, the period $T_D$ defines the critical time from data launch to data capture. Measurement of this interval provides an accurate indication of the speed of logic circuit 5 of FIG. 1.

Figure 8:
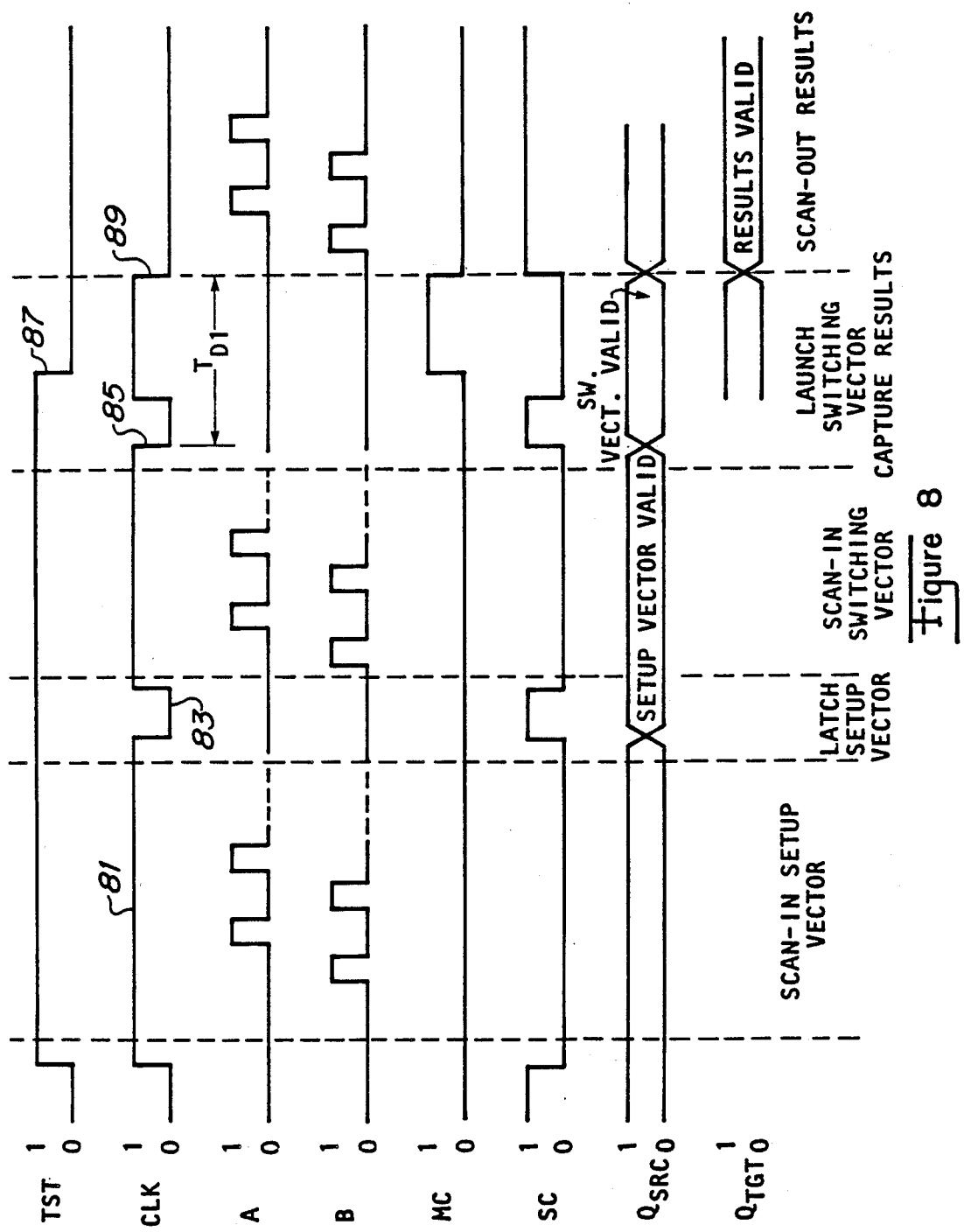
Figure 2:
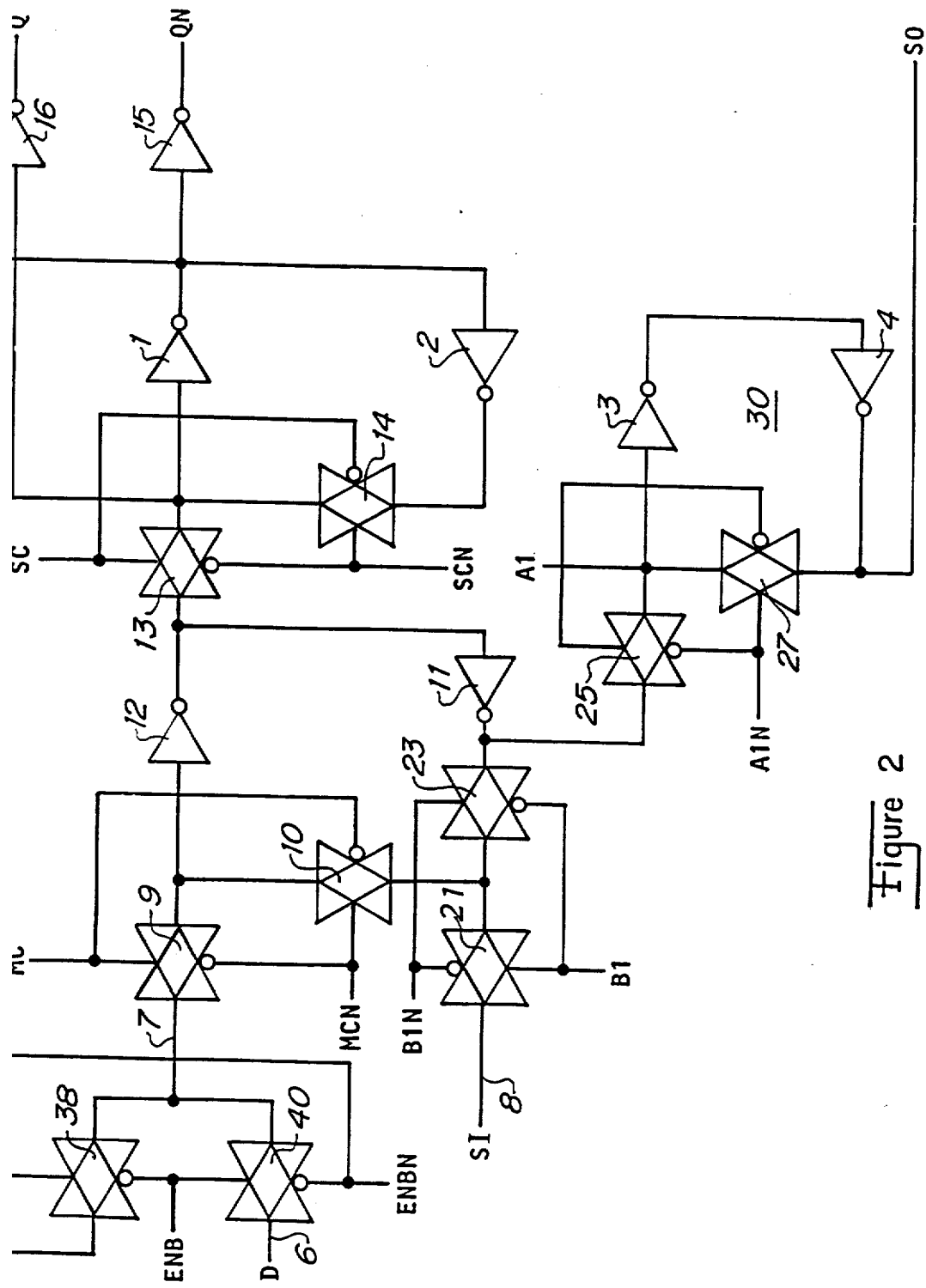

Referring now to FIG. 8, there is shown the timing relationships for operation of the alternate embodiment of the invention using the driver circuit of FIG. 4. As before, the test cycle begins by bringing the TST control signal high. Coincident with the rise of the TST signal, the CLK is also brought high 81. This causes the master and slave latches to be isolated from each other. The setup vector is then scanned-in in exactly the same fashion as was previously described. The CLK is then pulsed low 83 causing the setup vector to be transferred through the slave latch to the logic circuit 5. The switching vector is then scanned into the master latch and is launched to the logic circuit 5 on the falling edge 85 of the next CLK pulse. The TST signal is then returned low 87 to allow the test result data to enter the master latch of the target flip-flop. On the next falling edge 89 of the CLK pulse, the test result data is latched in the master latch of the target flip-flop. The data is then scanned-out for comparison against the predicted results. In this embodiment, the interval $T_{D1}$ defines the critical time from data launch to data capture. As shown in FIG. 8, this is determined by the full period of the CLK signal.

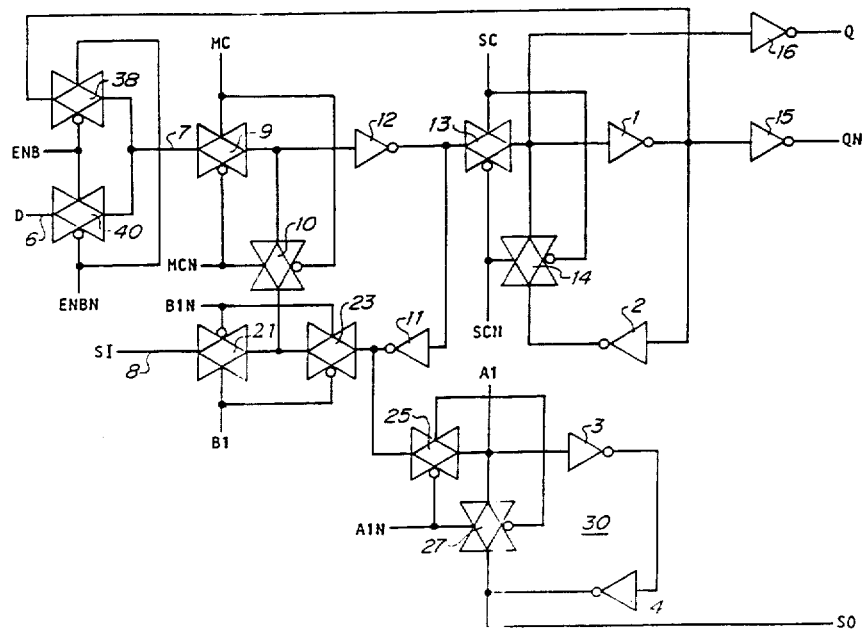

What is claimed is:

1. A scannable latch circuit for processing bits of data, said scannable latch circuit comprising:
    a first latch having a data input, a control input and a first and a second outputs, for receiving data on said input and holding the first output at a value received at the data input in response to a first control signal, said control input of the first latch coupled to receive the first control signal;
    a second latch having a data input, a control input and an output, for holding the output of the second latch at a value received at the data input in response to a second control signal, the data input of the second latch coupled to the first output of the first latch, said control input of the second latch coupled to receive the second control signal;
    a third latch having a data input, a control input and an output, for holding the output of the third latch at a value received at the data input of the third latch in response to a third control signal, said data input of the third latch coupled to the second output of the first latch, said control input of the third latch coupled to receive the third control signal; and
    enable circuitry having a first data input, a second data input, a control input and an output, for providing data to the first latch in response to an enable signal, the first input of the enable circuitry coupled to the output of the second latch, the second input of the enable circuitry coupled to receive data, the control input of the enable circuitry coupled to receive the enable signal and the output of the enable circuitry coupled to the first data input of the first latch.

2. The scannable latch circuit of claim 1, wherein the first latch comprises a second data input coupled to receive data, four transmission gates and two inverters coupled to provide the data on the first data input at the output of the first latch in a first state, to provide the data on the second data input at the output of the first latch in a second state, and hold the output of the first latch stable in a third state.

3. The scannable latch circuit of claim 1, wherein the second latch is comprised of a pair of inverters and a pair of transmission gates coupled to provide the data on the input of the second latch at the output of the second latch in first state and hold the output of the second latch stable in a second state.

4. The scannable latch circuit of claim 1, wherein the third latch is comprised of a pair of inverters and a pair of transmission gates coupled to provide the data on the input of the third latch at the output of the third latch in a first state and hold the output of the third latch stable in a second state.

5. A combination clock driver and scannable latch to facilitate at-speed testing of integrated circuits, said combination comprising:
    a master latch having a data input, scan input, control inputs and a first and a second outputs, the data input and the scan input coupled to receive data and the control inputs coupled to receive master control signals, the master latch selecting data from one of the scan input and the data input and holding the selected data at the first output in a stable state in response to the master control signals;
    a slave latch having a data input, a control input and an output, the data input coupled to the first output of the master latch and the control input coupled to receive a slave control signal the slave latch holding the data at the output in a stable state in response to the slave control signal;
    an auxiliary latch having a data input, a control input and an output, the data input coupled to the second output of the master latch and the control input coupled to receive an auxiliary control signal, the auxiliary latch receiving and storing data from the second output of the master latch in response to the auxiliary control signals; and
    clock driver circuit having inputs coupled to receive a clock signal and a control signal for producing the master control signals and the slave control signals, said clock driver circuit having first and second outputs for sending the master control signals coupled to the control inputs of the master latch for selecting the input to the master latch and latching the master latch, and a third output for sending the slave control signal coupled to the control input of the slave latch for latching the slave latch.

* * * * *

UNITED STATES PATENT AND TRADEMARK OFFICE
CERTIFICATE OF CORRECTION

PATENT NO. : 5,130,568
DATED : July 14, 1992
INVENTOR(S) : Miller et al

It is certified that error appears in the above-indentified patent and that said Letters Patent is hereby corrected as shown below:

The title page, showing an illustrative figure, should be deleted and substitute therefor the attached title page.

Signed and Sealed this

Twentieth Day of December, 1994

Attest:

BRUCE LEHMAN

*Attesting Officer*  *Commissioner of Patents and Trademarks*

United States Patent [19]

Miller et al.

[11] Patent Number: 5,130,568

[45] Date of Patent: Jul. 14, 1992

[54] SCANNABLE LATCH SYSTEM AND METHOD

[75] Inventors: Brent W. Miller, Menlo Park; William W. Walker, Los Gatos; Laurence H. Cooke, San Jose, all of Calif.

[73] Assignee: Vertex Semiconductor Corporation, Sunnyvale, Calif.

[21] Appl. No.: 609,398

[22] Filed: Nov. 5, 1990

[51] Int. Cl.⁵ .................. H03K 3/289; H03K 3/286
[52] U.S. Cl. ........................ 307/272.2; 307/272.1; 324/158 R; 371/22.3
[58] Field of Search .............. 307/272.2, 279, 272.1; 324/158 R; 371/22.3

[56] References Cited

U.S. PATENT DOCUMENTS

| | | | |
|---|---|---|---|
| 3,539,836 | 11/1970 | Seelbach et al. | 307/269 |
| 3,984,702 | 10/1976 | Fett | 307/238 |
| 4,258,273 | 3/1981 | Straznicky et al. | 307/221 R |
| 4,357,703 | 11/1982 | Van Brunt | 371/15 |
| 4,419,762 | 12/1983 | Paul | 377/66 |
| 4,424,581 | 1/1984 | Kawai | 365/154 |
| 4,495,628 | 1/1985 | Zasio | 377/70 |
| 4,495,629 | 1/1985 | Zasio et al. | 377/70 |
| 4,540,903 | 9/1985 | Cooke et al. | 307/465 |
| 4,553,236 | 11/1985 | Zasio et al. | 371/15 |
| 4,587,480 | 5/1986 | Zasio | 324/73 R |
| 4,621,363 | 11/1986 | Blum | 371/25 |
| 4,646,331 | 2/1987 | Ely | 307/529 |
| 4,782,283 | 11/1988 | Zasio | 324/73 R |
| 4,785,200 | 11/1988 | Huntington | 307/279 |
| 4,912,709 | 3/1990 | Teske et al. | 371/22.3 |
| 5,015,875 | 5/1991 | Giles et al. | 307/272.2 |

FOREIGN PATENT DOCUMENTS

| | | | |
|---|---|---|---|
| 0079328 | 5/1983 | Japan | 307/272.2 |
| 0158817 | 6/1989 | Japan | 307/272.2 |

Primary Examiner—Stanley D. Miller
Assistant Examiner—Terry D. Cunningham
Attorney, Agent, or Firm—A. C. Smith; Greg T. Sueoka

[57] ABSTRACT

A scannable latch system comprises a plurality of scannable latches and clock driver circuit that allow at-speed testing of integrated circuits. Each scannable latch comprises a master latch, a slave latch and an auxiliary latch. The master latch is a two input latch capable of receiving data from two sources. The output of the master latch is coupled to the input of the slave and auxiliary latches. The clock driver circuitry receives a clock and control signals which are transformed into signals that operate the scannable latch in three different modes. In the normal mode, the slave latch is transparent and the data is held primarily in the master latch. In the scan mode, data may be shifted into the master, shifted out through the auxiliary latch, or shifted both in and out with a propagate function. Finally, in a test mode independent data values may be stored in the master latch and the slave latch.

5 Claims, 7 Drawing Sheets